United States Patent
Voigt (10) Patent No.: US 7,353,160 B2
(45) Date of Patent: Apr. 1, 2008

(54) METHOD FOR CONTROLLING SEQUENTIAL OBJECT-ORIENTED SYSTEM-SIMULATIONS

(75) Inventor: Jens Voigt, Dresden (DE)

(73) Assignee: ACTIX GmbH, Dresden (DE)

( * ) Notice: Subject to any disclaimer, the term of this patent is extended or adjusted under 35 U.S.C. 154(b) by 0 days.

(21) Appl. No.: 10/546,464

(22) PCT Filed: Feb. 18, 2004

(86) PCT No.: PCT/DE2004/000303

§ 371 (c)(1),
(2), (4) Date: Jun. 16, 2006

(87) PCT Pub. No.: WO2004/075050

PCT Pub. Date: Sep. 2, 2004

(65) Prior Publication Data

US 2006/0235674 A1    Oct. 19, 2006

(30) Foreign Application Priority Data

Feb. 20, 2003    (DE) ................................ 103 07 408

(51) Int. Cl.
 *G06F 17/50*    (2006.01)
 *H04B 17/00*    (2006.01)
(52) U.S. Cl. ........................................ 703/17; 719/310
(58) Field of Classification Search ............... 703/2, 703/16, 17, 18, 19; 719/310
See application file for complete search history.

(56) References Cited

U.S. PATENT DOCUMENTS

| | | | |
|---|---|---|---|
| 5,794,005 A | 8/1998 | Steinman | ..................... 703/17 |
| 6,097,885 A | 8/2000 | Rayner | .......................... 703/17 |
| 6,650,731 B1 * | 11/2003 | Steltner et al. | ........... 379/15.01 |
| 7,085,703 B2 * | 8/2006 | Gabele et al. | ................. 703/17 |
| 2005/0246712 A1 * | 11/2005 | Ferris | .......................... 719/310 |
| 2006/0089826 A1 * | 4/2006 | Gabele et al. | ................. 703/17 |

FOREIGN PATENT DOCUMENTS

| | | |
|---|---|---|
| DE | 101 04 926 A1 | 11/2001 |
| EP | 0854429 | 7/1998 |

OTHER PUBLICATIONS

Zeigler, B.P.: Object Oriented Simulation with Hierarchical, Modular Models: Selected Chapters Updated for DEVS-C++, 1995, pp. 49-59; pp. 92-104.
Zeigler, B.P.: Object Oriented Simulation with Hierarchical, Modular Models: Intelligent Agents and Endomorphic Systems, DEVS-C++, 1995, pp. 311; pp. 34-59.
HSIM1 and HSIM2: Object Oriented Algorithms for VHDL Simulation, Ganguly, 7th International Conference on FLVSI Design, Jan. 1994, pp. 175-178.

* cited by examiner

*Primary Examiner*—Thai Phan
(74) *Attorney, Agent, or Firm*—Heslin Rothenberg Farley & Mesiti P.C.

(57) ABSTRACT

In a method for controlling sequential object-oriented system-simulations, presentation of an object of a group of objects to an instance-to-class is carried out in the following manner. The instance is produced by adjusting at least one parameter in the part of a simulation program. The instances produce and treat events for simulating a communication between objects, the simulation process being controlled by the activation of instances. The simulation process control is carried out according to a cycle consisting of determined cycle steps, the events being recorded in an event-recording area which is assigned to a target instance.

20 Claims, 6 Drawing Sheets

METHOD FOR CONTROLLING SEQUENTIAL OBJECT-ORIENTED SYSTEM-SIMULATIONS

CROSS REFERENCE TO RELATED APPLICATIONS

This application is a 371 filing of PCT International application No. PCT/DE2004/000303 filed on Feb. 18, 2004 and published in German as WO2004/075050 A2 on Sep. 2, 2004 which claims priority of German application No. 103 07 408.2 filed Feb. 20, 2003, the disclosures of which are hereby incorporated by reference in their entirety herein.

BACKGROUND OF THE INVENTION

The invention concerns a process for the sequence control of sequential object-oriented system simulations in which objects with at least several identical properties are combined to form object groups and the object groups are mapped into classes and each class is realized by a simulation program part, whereby the mapping of an object from an object group in an instance of a class occurs in such manner that the instance is realized by setting at least one parameter in the simulation program part, whereby the latter becomes a parameterized simulation program part, in which the instances for simulation of communication between objects generate and process events, which is realized by a sequence of the parameterized simulation program parts, whereby the simulation sequence is controlled by activations of instances.

A system simulation is the execution of a computer-controlled program, which models the system to be tested in an abstraction sufficient for the investigation purpose. A dynamic simulation represents a system in the same way as it responds in time. A time-discrete simulation is a dynamic simulation in which the states of the objects participating in the simulation change at discrete time points in a continuous time scale. Such simulations are realized, for controlling the size and complexity of such programs, in line with an object-oriented principle, i.e. the program consists of program objects which communicate with each other.

Time-discrete system simulations are typically used in the telecommunications industry for designing, optimizing and validating radio-communication access networks as, in contrast to static "Monte Carlo simulations", they can simulate a time history of the simulated model, which is necessary for analyzing the influence resulting from the movement of mobile radio-communication participants, a large number of packet-switched services or also the increasing use of adaptive components in radio-communication access networks, for example with a WCDMA multiple access process. As a result, time-discrete system simulations are also particularly suitable in order to be able to examine algorithms of a radio-communication access network, such as those which occur during administration of the radio-communication network. in this context a radio-communication access network is the radio-communication network-relevant part of a mobile radio communications network.

Control of the sequence between objects in time-discrete simulations is a task of the simulation sequence control, which implements one or more simulation processes. A simulation process is, for example, the semantics of communication between objects, according to E. A. Lee and A. Sangiovanni-Vincentelli: A Framework for Comparing Models of Computation, in IEEE Transactions on Computer Aided Design of Integrated Circuits and Systems, vol. 17(12), pp. 1217-1229, Dec. 1998.

In E. A. Lee, "Modeling Concurrent Real-time Processes Using Discrete Events", invited paper, Annals of Software Engineering, Special Volume on Real-time Software Engineering, vol. 7 (1999), pp. 25-45. Feb. 1997, a sequence control of a time-discrete simulation is represented by means of discrete events. The communication between objects is handled via events here. In addition to the information to be exchanged between objects, the information value, events include an address value which can consist of the source address and target address, and a time stamp, via which they can be arranged in a chronological order, for example. Further possible arrangement criteria are a topological sorting or user-dependent priorities of the communicating objects.

Figure 1:
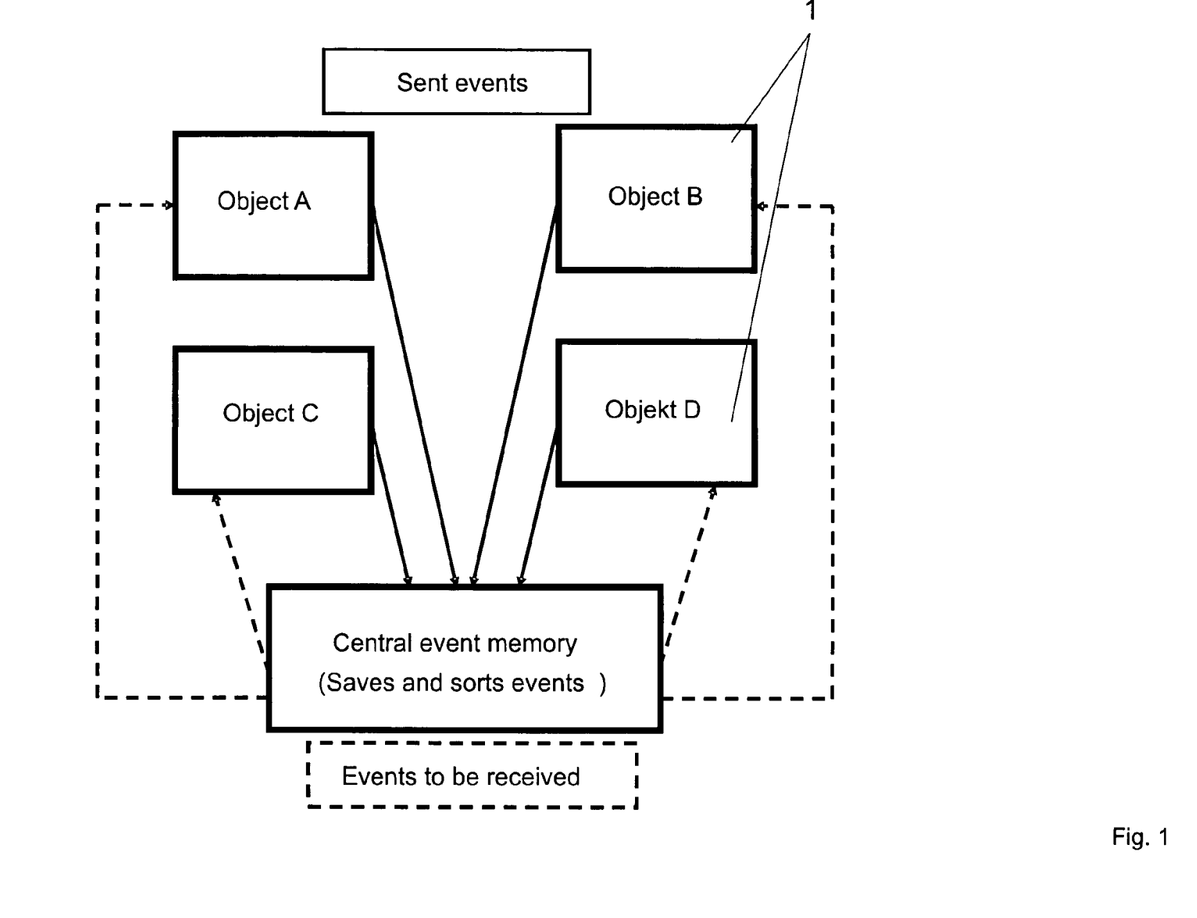
FIG. 1 shows a simulation flow controlled by a discrete events from the prior art.

As a result of the event searching with the smallest time stamp respectively in the central event memory and the forwarding of this event to the object receiving the event as well as its processing of the event and the return of no, one or several events to the central event memory, the simulation and hence the simulation time progresses, as can be seen in FIG. 1. Simulations by means of discrete events therefore belong to a group of run-time-planned simulation processes. Run-time-planned simulation processes only plan or generate the sequence of the simulation as far as the run-time of the program itself. In contrast to this, compiler-time planned simulation processes plan the sequence of a simulation before execution of the program.

In extensive simulations, very many events occur through communication between the objects. These events must be classified in the list or lists of the central event memory, even if they serve for communication between completely independent objects. Both the assignment to these lists and the event search with the smallest respective time stamp can be very time consuming when there are very long event lists with very many events.

The latest knowledge concerning the theory of time-discrete system simulations shows, amongst other things, in (J. Voigt and G. Fettweis: A Cycle-Based Approach for Parallel Simulations of Mobile Communications Networks, in: Symposium on Performance Evaluation of Computer and Telecommunications Networks (SPECTS'2k), pp. 139-143, Vancouver, BC, Canada, Jul. 2000) and in DE 101 04 926 A1, that the communications of objects can occur synchronously and also in an event cycle. The sequence of the simulation is already known before the beginning of a simulation through knowledge concerning the synchronism of the reception time of the events and hence the event cycle.

Sequential simulations by means of a discrete event must inevitably handle all events in one global defining relation. This can oppose the nature of the system to be simulated or lead to an over-specification of the model, which can be regarded as detrimental as it requires a great deal of computing time. A further disadvantage lies in the fact that they require a central event memory which brings all of the events occurring in the simulation into the requisite global definition relation.

In addition to the detrimental requirement of high resource utilization associated with this, a relatively large amount of the total computing time for a simulation must therefore be used for sorting the lists of the central event memory alone.

SUMMARY OF THE INVENTION

The invention is based on the task of indicating a process for sequence control of sequential object-oriented system simulations, which enables better utilization of the resources of a computer when executing a system simulation, enabling a faster simulation sequence.

Corresponding to the invention, the task is solved in such manner that control of the simulation sequence occurs in a first simulation level by a main program after a cycle saved in the main program and consisting of determined cycle increments, that for processing a first cycle increment of a first cycle at least one instance in the first cycle increment of a first class in the first cycle increment is selected by the main program for generating at least one first event, whereby the event is realized by a value calculated with the parameterized simulation program part, consisting at least of an information value and a time value with a cycle number and a cycle increment number, which is saved in an event memory assigned to a target instance and after generation of the first or all events is concluded the program control is returned to the main program, that the main program, if necessary, selects one or more further instances from the same or another class for generation and saving of at least one event each, if these are defined in the first cycle increment, until all the instances defined in the cycle increment are processed and the processing of the first cycle increment is terminated by the return of the program control to the main program, that for processing a further cycle increment of the first cycle at least a first instance in the further cycle increment of a first class in the further cycle increment is selected by the main program, whereby the parameterized simulation program part of the selected instance searches thorough the event memory assigned to it for events via search parameters, that in the case of correspondence of the search parameters, the associated information value of the event by the parameterized simulation program part belonging to the instance, corresponding to the properties of the instance, is processed, that as a result of processing no, one or several events are generated and saved in an event memory area assigned to a target instance and the program control is returned to the main program, that in the case of no correspondence of the search parameters with the parameters of the events saved in the associated event memory, the program control is returned to the main program, that further instances in succession, for searching and processing events, are selected until all the instances defined in the second cycle increment are processed and the processing of the further cycle increment, by the return of the program control to the main program, is terminated, that the main program runs through all further cycle increments of a cycle in succession, insofar as they are present, until the end of the first cycle is reached and that the main program periodically continues processing the simulation in a subsequent cycle, until either a specified number of cycles has passed or no further current event is to be processed, that in selected cycle increments and/or cycles of the simulation sequence, values of events and/or values generated by the processing of events by an instance are saved and subsequently evaluated by an evaluation program part.

The control of the simulation sequence occurs via a main program. As the sequence of the communication between instances executes in line with a previously known cycle, with a specified number of cycle increments, this is stored in the main program for sequence control, in the form of a program code.

A cycle determines a run of the simulation in a simulation level. A system simulation can extend over one or more simulation levels, whereby the time point and the order in a simulation level change is controlled by the main program.

For processing a first simulation level, the main program selects instances in succession from the same or different classes, which then generate events. In other words, the main program branches the program processing into a parameterized simulation program part assigned to the instance for calculating a value. For this purpose, instances are defined in the main program, each assigned to one cycle increment of a cycle, which have to be taken into account when processing the simulation. An event represents a value which comprises an information value and a time value. At the same time, the time value consists of a cycle number and a cycle increment number and typically serves to control the processing of events in a chronological order. The information value can typically contain data to be transferred or information as to the reason for generation of the events.

The memory area intended for current program data, the event memory, is divided into areas, whereby each instance is assigned to its own area of this memory, an event memory area. If an event is now generated by a selected instance, in other words a value is calculated, this value is then saved in the event memory area of the instance for which the event is determined. As a result of this decentralization of the event memory in the sense of the invention, the partial value of the event required in the prior art, which comprises the target instance for the address, is now no longer required.

After generation of all events in a first cycle increment of a first cycle, the main program continues processing in a further cycle increment of the same cycle, until all cycle increments of the current cycle have passed. Each instance of every class selected by the main program processes the events assigned to it and thereby generates no, one or several events for itself or other instances and then in turn saves these assigned to the individual instances. The order for processing the events in the event memory area can be specified for this. If the event memory area of the instance selected for program continuation does not contain an event, the instance returns the program control to the main program, which then continues the processing with the next instance to be selected.

In this way, all instances defined in the relevant cycle increments of a cycle are processed. The end of the simulation run can typically be reached after execution of a specified number of cycles. The simulation is also terminated if no further event is to be processed by an instance.

Values are saved during the simulation sequence for subsequent analysis and representation of the simulation results. These values can be events, partial values of events or intermediate values generated through the processing of events, by an instance. Analysis of these values can be performed by the main program, by an analysis part of the main program intended for this or by an analysis program independent of the main program. In the results of the analysis, for example, statements can be made on the received field strength distribution in the simulation area to be examined, the behavior of a mobile radio-communications network depending on the number of mobile communication participants or their movement within the simulation region or the performance of the network if individual parameters are changed, such as the spatial distribution of the base stations or a change of the transmitter power.

In a favorable version of the process, it is foreseen that the simulation continues in a further simulation level after completion of the first simulation level, and the simulation is continued after processing of all simulation levels in the first simulation level.

According to the process corresponding to the invention, the sequence control can execute during a system simulation in one or more simulation levels. For this, a first simulation level can typically map the parts of a mobile radio-communications network relevant to radio communications, in which various objects communicate with each other. In a second simulation level, the communication sequence can be mapped within an object mapped in the first level. In a further level, the communication within an assembly of the object can be mapped for example. The simulations levels are known to the sequence control. It controls the program run corresponding to the specifications via all simulation levels extant, by continuing after processing a cycle in a first simulation level in the relevant program run in a further simulation level, for processing a cycle of the further simulation level, branched and processing, after the cycle end of the further simulation levels, priority-controlled in the first or a subsequent simulation level.

In a form of the process corresponding to the invention, it is foreseen that the simulation during processing of a cycle increment of a cycle of a first simulation level is branched in a further simulation level and, after termination of the processing in the further simulation level, the processing is continued is a subsequent or the first simulation level.

A program branching into a further simulation level can occur not only after passing of a complete cycle of the first simulation level, but also during processing of a cycle increment of a cycle of the first level. In this case also, both the order and the number of simulations are known to the sequence control. Running through the simulation level can typically occur controlled through specification or through current simulation states.

In a further form of the process corresponding to the invention, it is foreseen that, in the further simulation level, the same process for sequence control of the system simulation is used or another process.

In the case of a simulation sequence over several simulation levels, the process corresponding to the invention is used in the first simulation level. Within further simulation levels, the process corresponding to the invention can also be used, as can another process, for example the process for sequence control by means of discrete events described in the prior art.

In a further form of the process corresponding to the invention, it is foreseen that, after processing of the event by the associated instance, the event is deleted from the event memory area.

After processing of one or all events of the event memory which is assigned to an instance, or at a later time point, the events are deleted from the event memory or overwritten by newer events.

In a particular embodiment of the invention, it is foreseen that a division of the memory area is performed by a partialization of the memory or by parameterization of the instance, and each event memory area is permanently assigned to a respective instance.

Part of a memory area intended for saving events is assigned to each instance. In this event memory which is assigned to the instance and hence decentralized, all the received events of the respective instance are saved until their processing by the instance itself. A subdivision of the memory can typically be performed by means of a table via a partialization, i.e. a division, of the memory into areas with a start and end memory address of an instance. A further option involves assignment of the parameters of the associated memory area to the respective instance itself. The instance then knows either the allocated start memory address and the size or the end memory address of the event memory area assigned to the instance. Decentralization of the event memory means that it no longer consumes resources to save the address of the target instance within an event, in contrast to the centralized event memory described in the prior art.

In a particular embodiment of the invention, it is foreseen that instances only save events in event memory areas set in the main program.

When controlled by the main program, an instance can only send events to definite instances, in other words it can only save events in definite decentralized event memories assigned to an instance respectively. This thus ensures a logical communication sequence of the instances.

In a favorable form of the process, it is foreseen that the control of the sequential processing of events occurs within a cycle increment in an event memory assigned to an instance via the time value of the event, via user-defined priorities or via topological sorting of the instance number, which is then a component of the event.

If several events are saved in an event memory assigned to an instance, the order for processing the events, which occurs in succession within the parameterized simulation program part, must be controlled. The time value of the events can, for example, be used for controlling the order. A processing can then occur via this time value in ascending or descending order. In addition to control via the time value, there are further options in the evaluation of the instance number, of the source instance generating the respective event. The instance number must be a component of the event generated by the source instance in this case.

In a further advantageous form of the process, it is foreseen that the processing for events of different instances within a cycle increment occurs in parallel through a configuration in various threads.

The processing of events within the parameterized simulation program part occurs in succession. For controlling the processing speed of a simulation on a multiprocessor system, however, the processing of events of different instances chronologically parallel to each other can occur via a configuration of the program parts in various threads (program series).

In a further advantageous form of the process, it is foreseen that events which are received and processed by an instance for a time value generate events for other instances or themselves with the same time value.

During the generation of events by an instance, a value is calculated by the associated parameterized simulation program part, which also contains a time value amongst others. This is typically used for control of the processing order of events and consists of a cycle number and a cycle increment number. An instance can therefore generate a new event for another instance or itself with the time value of the event to be processed, by processing an event from the associated event memory area.

In a further advantageous form of the process, it is foreseen that events which are received and processed by an event for a time value generate events for further instances or themselves with a time value.

An instance can generate a new event for other instances or itself with a time value, by processing an event from the associated event memory area, which differs in the cycle number and/or cycle increment for the time value of the event to the processed.

The invention is to be explained below in more detail by means of four embodiment examples. In the accompanying drawings:

DETAILED DESCRIPTION

EMBODIMENT EXAMPLE 1

An explanation of the terms used and their relation to each other is outlined in embodiment example 1.

Figure 3:
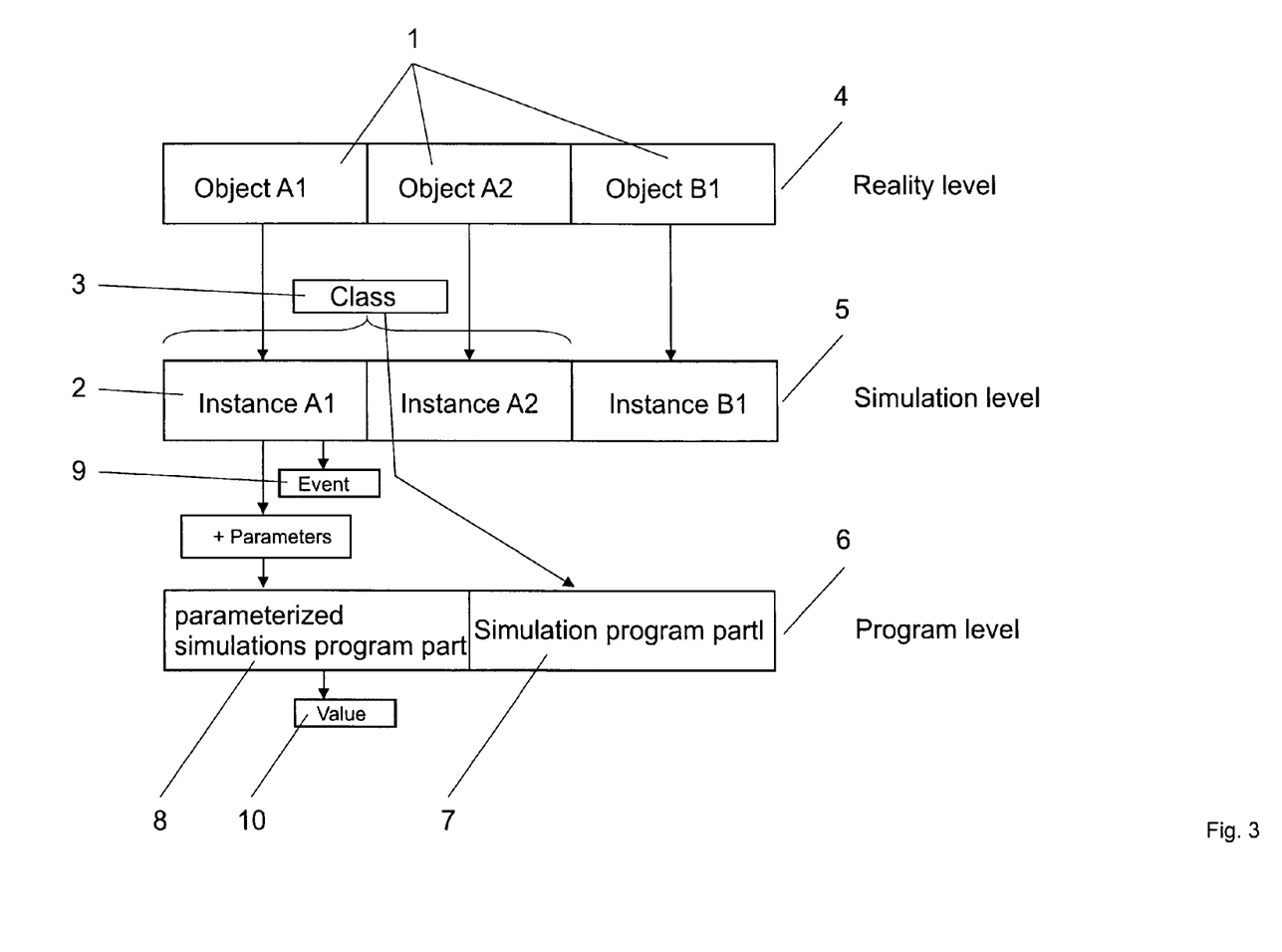
FIG. 3 shows a representation of the levels corresponding to the invention.

For representation of objects (1) of a reality level (4) in a simulation level (5), these are mapped by so-called instances (2), as shown in FIG. 3. Several of these instances (2), which possess at least one common property, are classified in a class (3) of the simulation level (5). For the special case concerning simulation of a mobile radio-communications network, this could be the classes (3) of mobile phones, of base stations or of transmission channels.

Realization of a class of the simulation level (5) occurs via a simulation program part (7) in the program level (6), which converts the common properties or the same behavior of the instances (2) belonging to the class (3).

As the instances (2) of the simulation level (5) differ from each other by at least one property, exactly as the objects (1) of the reality level (4), parameters are assigned to the instances (2).

An instance (2) of a class (3) of the simulation level (5) is realized after allocation of at least one parameter in one parameterized simulation program part (8) of the program level (6). At least one of these assigned parameters from instance (2) to instance (2) must be different for this, in other words the instances (2) are individualized. A difference of the class (3) mobile phones can typically be in the parameters of the telephone number.

During the simulation sequence, selected instances (2) generate events (9). These events (9) are realized in the program level (6) by a value (10), comprising at least one information value and one time value with a cycle number and a cycle increment number. The instances (2) of the simulation level (6) communication with each other by means of these events (9) generated.

In this example, a simulation is described for a mobile radio-communications network within a specified area. For this, data on the base stations located in the simulation area, the mobile telecommunications participants, their location and their changes of location must be known to the main program in addition to data for the simulation area. Moreover, the main program must also receive information concerning which instance (2) induces which action at which time point. This typically refers to the connection setup or cleardown for a telephone conversation or the transmission of talk data packages. The temporal allocation of the individual actions of the mobile radio-communications (i.e. in which cycle increment (12) of which cycle (11) an instance (2) mapping the object (1) generates an event (9)) can either be specified beforehand or determined after predefinition by a random program part.

The main program controls the simulation sequence after the cycle 1 run through known to it with a specified number of cycle increments. For this, the main program will branch the program processing into individual parameterized simulation program parts (8) realizing an instance (2),each, beginning with the first cycle increment (12) of the first cycle (11). After the program processing within a parameterized simulation program part (8), in which for example an event is generated, the sequence control is returned to the main program again and the processing continued in a further instance (2) defined in this cycle increment (12) by transfer of the program control to the associated parameterized simulation program part (8). The values (10) generated during processing of the parameterized simulation program parts (8) represent the events (9) of the simulation sequence which are decentrally saved in the event memory areas 13 permanently assigned to individual instances (2). In the example, the mobile radio-communications participant A1, who is mapped by the instance (2) A1 in the simulation level (5), could establish a conversation with a further radio-communications participant A2. The event (9) generated by A1 is saved in this case in the event memory area 13 of the transmission channel B1. see FIG. 4.

Figure 4:
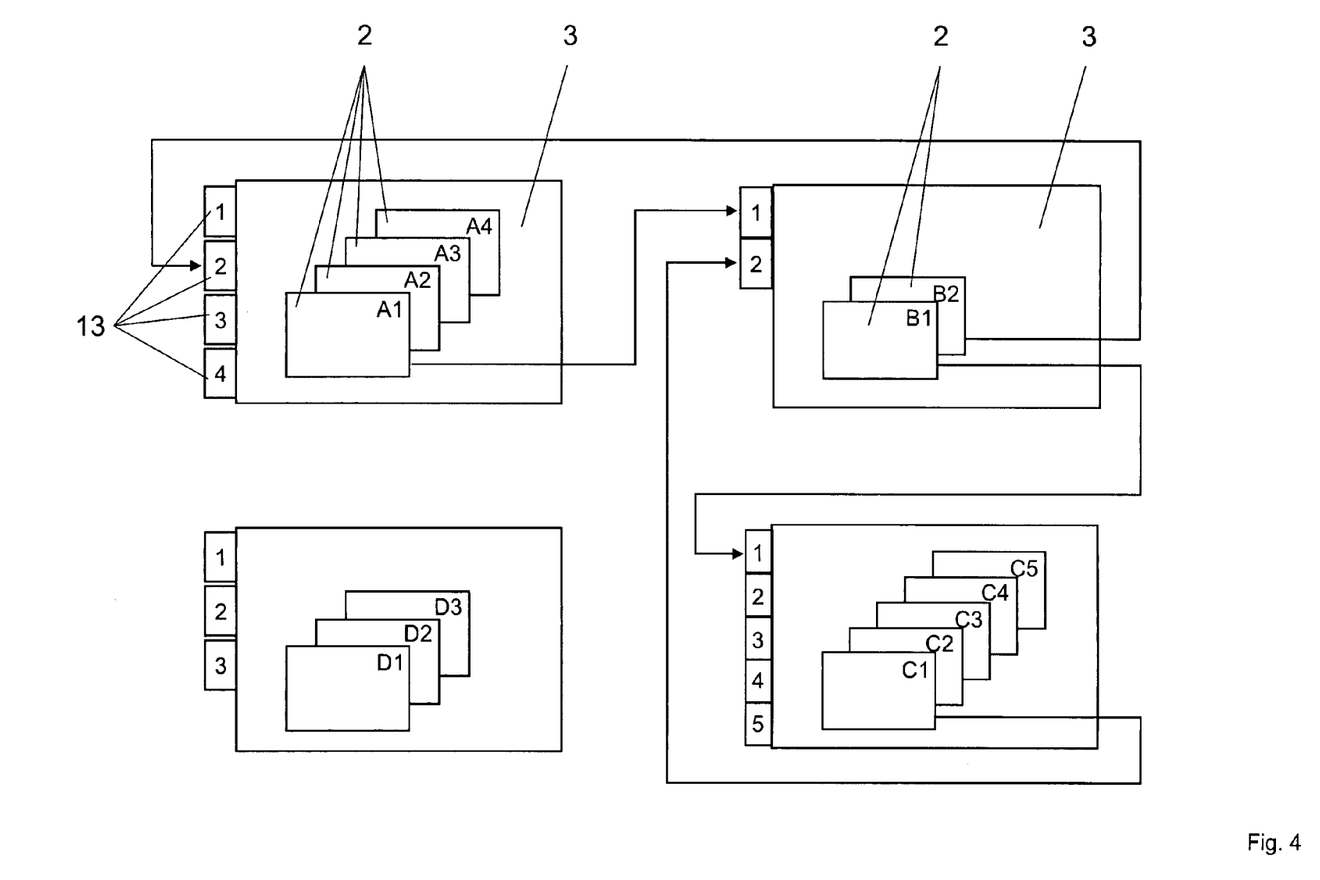
FIG. 4 shows an example of the sequence control of a simulation by the process corresponding to the invention.

After processing all instances (2) defined in the cycle increment (12) of all classes (3) entered in the simulation, the main program continues the simulation in the subsequent cycle increment (12).

Figure 5:
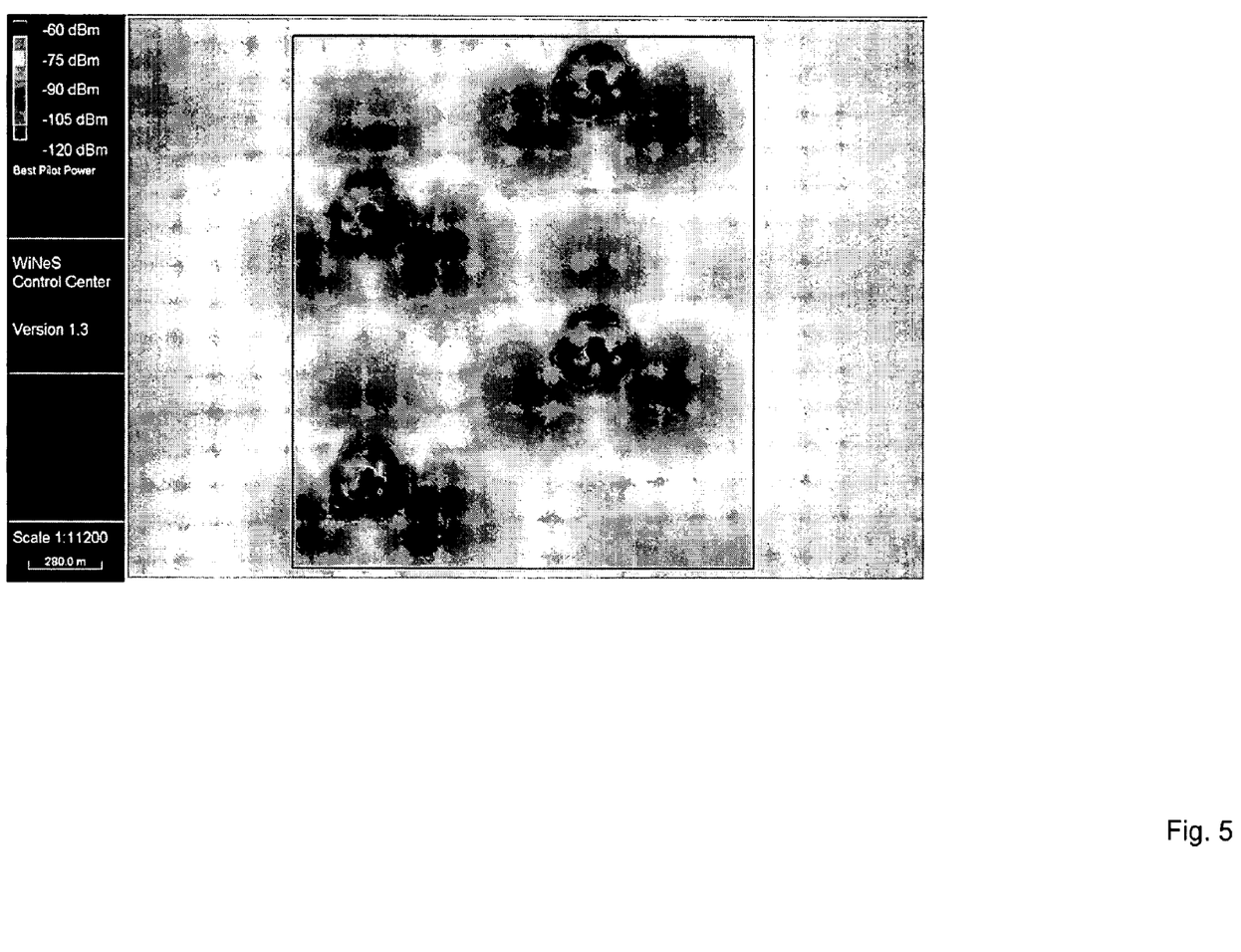
FIG. 5 shows the graphically depicted event of a simulation in the mobile communications sector in a test area and FIG. 6. shows a graphical representation of the required computing times by comparing the process corresponding to the invention with the prior art.

For this purpose, the program control is transferred by the main program at a definite time point to the parameterized simulation program part (8) realizing the transmission channel B1. This processes the value 13 saved in the event memory part 13, corresponding to its properties. The event (9) of A1 to be transferred is changed through the properties of the transmission channel. As a result of the processing of B1, a further event (9) is generated for the base station C1. This event (9) is now stored in the event memory area 13 of the instance (2) C1, which maps the base station C1. After processing further instances (2) and/or cycle increments (12), the program control is transferred by the main program to the parameterized simulation program part (8) realizing the instance (2) C1. This processes the event (9) and generates a further event which is saved assigned to the transmission channel B2. The parameterized simulation program part (8) realizing the instance (2) B2 processes the event (9) and generates a further event which is saved assigned to the mobile radio-communications participant A2 mapped by the instance (2) A2. This event (9) is in turn processed by the instance (2) A2 and initiates "ringing" at the mobile telephone receiving the call, as this involves a connection setup between A1 and A2. In addition to this connection setup, the main program also controls further communications between various other instances (2) and saves selected values (10), partial values or intermediate results from a processing for analysis purposes. These are processed by an analysis program part and represented graphically as shown in FIG. 5 for example. Analysis of the graphics enables the expert to make statements concerning weak points within the simulation environment. There is now the option of performing a further simulation sequence with altered parameters of one or more objects and comparing the results of the simulation.

EMBODIMENT EXAMPLE 2

In a further example, eight time slots of the duration 0.577 ms in a time frame of duration 4.615 ms are transferred in a GSM system. The cycle (11) given as an example in FIG. 2 can now, depending on the required time slot of the model to be simulated, be applied to each time slot or also to each time frame, in order to hence realize a simulation sequence control for time-discrete and object-oriented system simulations of the GSM mobile radio-communications system in accordance with the process corresponding to the invention. In this way, a time-discrete system simulation of a radio-communications access network according to the GSM mobile radio-communications standard can be controlled in the operational sequence with the process corresponding to the invention.

EMBODIMENT EXAMPLE 3

The following embodiments refer to the product "WiNeS-Wireless Network System Simulator" provided by Radioplan GmbH, Dresden.

Figure 2:
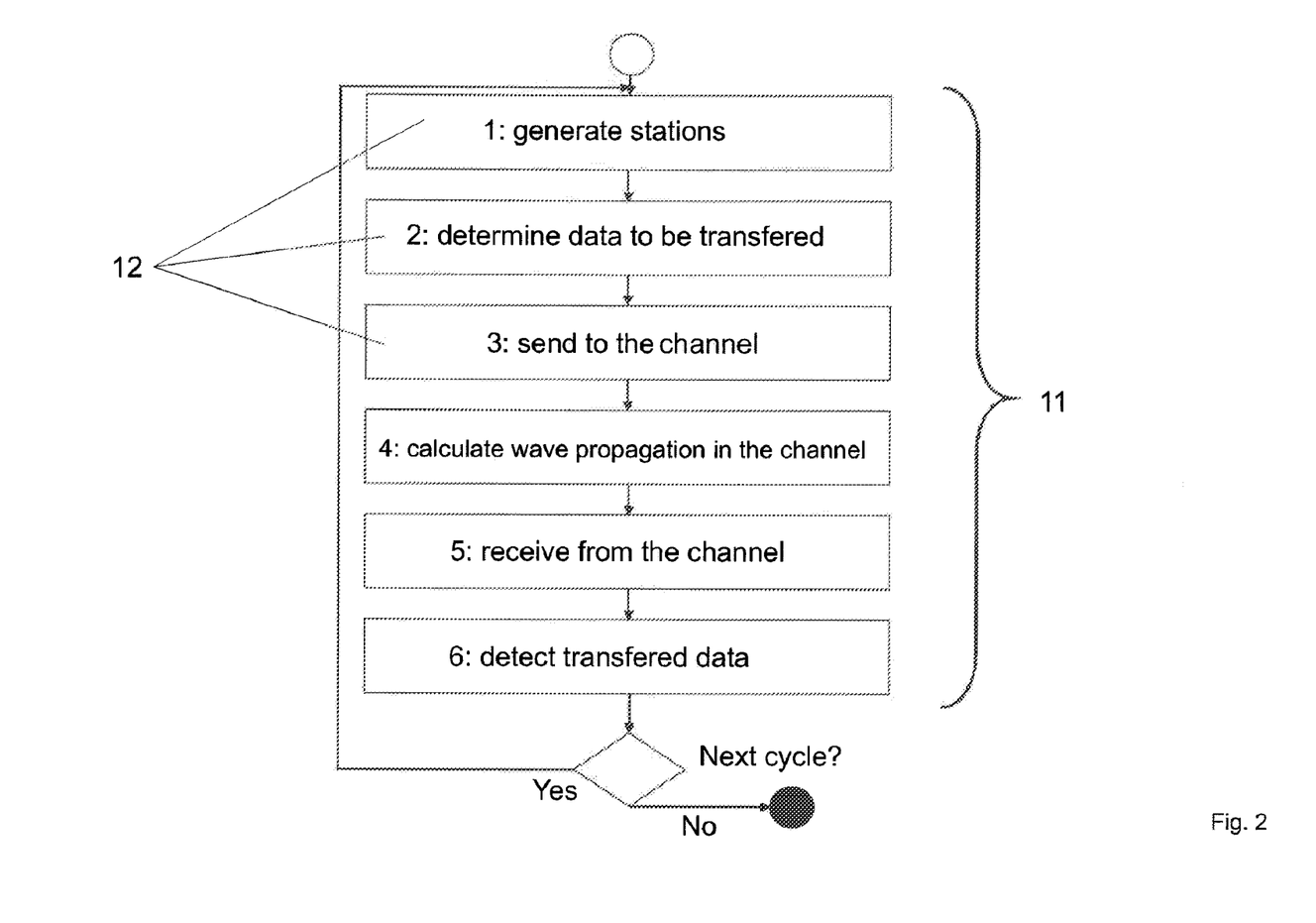
FIG. 2 shows a possible event cycle for the process corresponding to the invention.

An existing time-discrete and object-oriented system simulator for the UMTS mobile radio-communications network has been designed as a modular system such that its simulation sequence control can be exchanged. The simulation sequence control is therefore a component which is used by the part of the time-discrete and object-oriented system simulator for UMTS modeling the radio-communications access network. Two simulation sequence controls which can be used completely separately of each other exist. The first simulation sequence control implements a sequential process by means of discrete events corresponding to FIG. 1. This simulation sequence control is based on the public-domain tool Ptolemy II 1.0.1 of the University of Calif. at Berkley, USA (http:H//Ptolemy.eecs.berkeley.edu) and is implemented in the programming language Java. A second simulation sequence control implements the process corresponding to the invention in accordance with claim 1 and FIG. 4 with a cycle 11 as shown in FIG. 2, also in the programming language Java.

In order to demonstrate an acceleration of the simulation sequence under the same simulation conditions, a typical test area was simulated as part of a UMTS network with both simulation controls for a simulation time kept constant (simulated real time) and, at the same time, the requisite computing times were compared for both simulation sequence controls at different traffic loads. For this, the computer hardware and software used were identical, apart from the simulation sequence control. In this connection, the traffic load is by definition proportional to the number of simulated mobile stations.

The service used by the mobile stations was a bidirectional and circuit-switched service with a nominal data rate of 012.2 kbit/s and a voice activity of 66%. A standard personal computer with an AthlonXP1.7 processor and the operating system Microsoft Windows 2000 Professional was used as a test computer. The Java Virtual Machine used was: java version "1.3.1_02" Java TM) 2 Runtime Environment, Standard Edition (build 1.3.1_02-b02), Java HotSpot (TM) Client VM (build 1.3.1_02-b02), mixed mode. The simulated UMTS test area comprised 4 NodeBs with a spacing of 200 m respectively. Each NodeBs contains three cells, so that a total of 12 cells were therefore available. For the geographical arrangement of the test area, see also FIG. 5.

Figure 6:
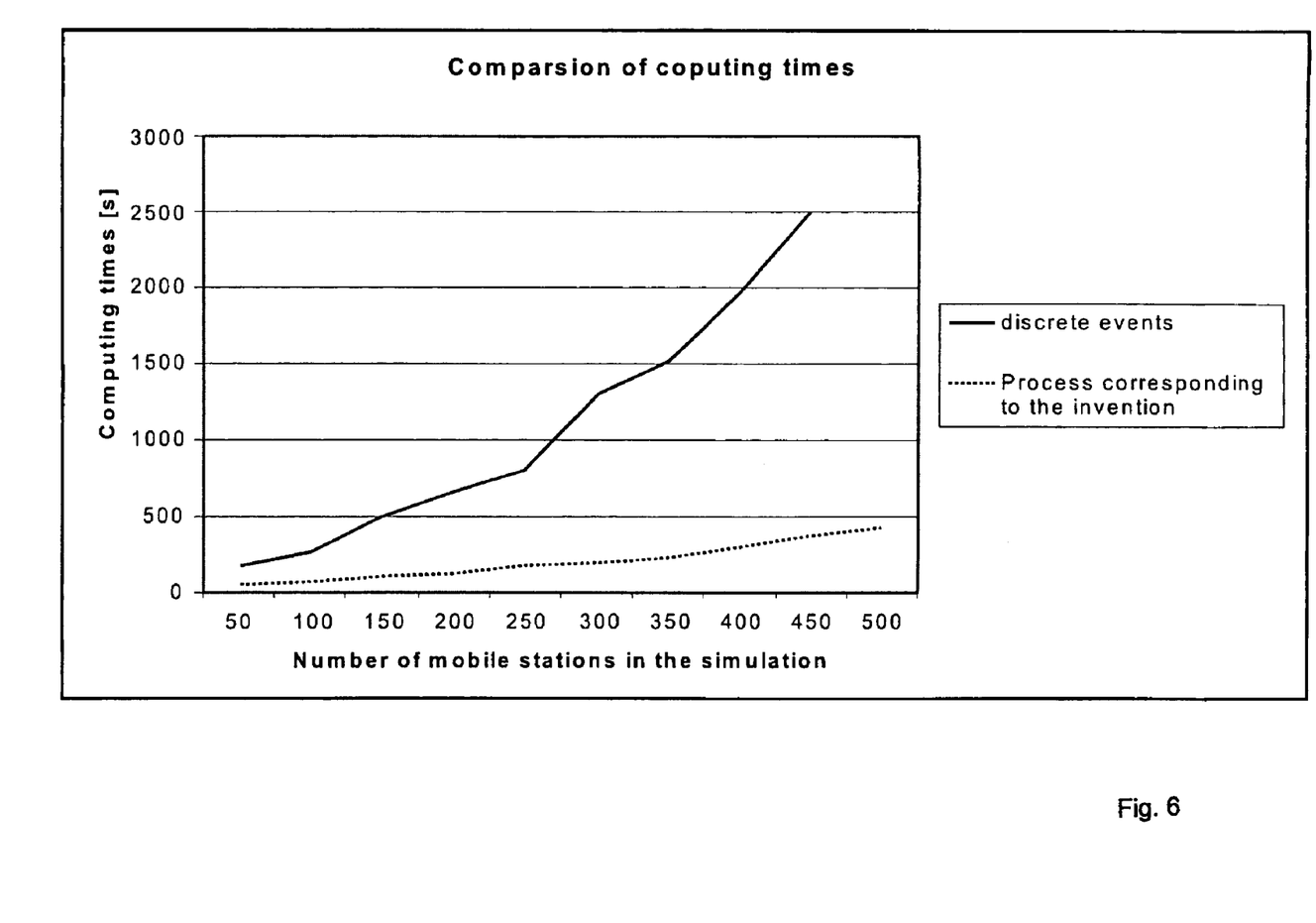

The results from comparison of the requisite computing times for identical simulations but different simulation sequences is shown in FIG. 6. For constant simulation times respectively, the number of mobile stations located in the simulation was increased. It is clearly discernible in FIG. 6 that the simulation sequence control according to the process corresponding to the invention requires for all traffic loads considerably shorter computing times for the same simulation load and time than does the simulation sequence according to the standard process of the prior art by means of discrete events.

The ascertained acceleration of the simulation sequence is discernible from FIG. 6 through application of the process corresponding to the invention in such manner that overall a significantly more time-efficient simulation sequence control of the process corresponding to the invention is attained in comparison to the standard process of the prior art by means of discrete events, even if implementation-specific attributes of the implementation of the simulation process by means of discrete events in Ptolemyll, for this see (J. S. Davis II, E. A. Lee. et. al.: Heterogeneous Concurrent Modeling and Design in Java, in technical report UCB/ERL No. M99/40, University of Calif., Berkley, USA, Jul. 1999) are calculated from FIG. 6.

EMBODIMENT EXAMPLE 4

The transmission of information via the WCDMA (wideband code division multiple access) air interface in the mobile radio-communications standard UTRAN/FDD (universal terrestrial radio access network/frequency division duplex) occurs in time frames with a duration of 10 ms, see for example (H. Holma and A. Toskala: WCDMA for UMTS, John Wiley & Sons., Chichester, UK, 2000, ISBN 0-471-72051-8). The process corresponding to the invention with the cycle (11) shown in FIG. 2 is in turn used for controlling the sequence of a time-discrete system simulation according to the UTRAN/FDD mobile radio communications standard.

Nevertheless, with a WCDMA air interface a rapid power control is indispensable for an efficient mode of operation of the air interface itself. See for example (H. Holma and A. Toskala: WCDMA for UMTS, John Wiley & Sons., Chichester, UK, 2000, ISBN 0-471-72051-8). This rapid power control works in UTRAN/FEDD 15 times faster than the change of time frames. In other words, 15 times the transmission power is adjusted to the radio communication stations per time frame. However, the adjustment of the transmission only concerns the cycle increments (12) 3, 4 and 5 of the cycle (11) shown in FIG. 2. These three reception time points would therefore have to be processed 15 times within the cycle (11), in order to control a time-discrete system simulation of a radio-communications access network according to the UTRAN/FDD mobile radio-communications standard when modeling faster power control in the sequence. If the three abovementioned reception time points of events (9) are logged as an intrinsic cycle (11), which is processed a total of 15 times within the cycle (11) as shown in FIG. 2, this task can then be solved with the process corresponding to the invention by a division of the simulation into several simulation levels. For this, the global simulation sequence is represented in the first level and, in a second level, the faster simulation part adjusting the transmission power of the radio communication stations into which the simulation is then continually branched at definite time points.

The capabilities of one or more aspects of the present invention can be implemented in software, firmware, hardware or some combination thereof.

One or more aspects of the present invention can be included in an article of manufacture (e.g., one or more computer program products) having, for instance, computer usable media. The media has therein, for instance, computer readable program code means or logic (e.g., instructions, code, commands, etc.) to provide and facilitate the capabilities of the present invention. The article of manufacture can be included as a part of a computer system or sold separately.

Additionally, at least one program storage device readable by a machine embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

Process for the sequence control of sequential object-oriented system simulations

REFERENCE SIGN LIST

1 Object
2 Instance
3 Class
4 Reality level
5 Simulation level
6 Program level
7 Simulation program part
8 Parameterized simulation program part
9 Event
10 Value
11 Cycle
12 Cycle increment
13 Event memory area

The invention claimed is:

1. Process for sequence control of sequential object-oriented system simulations in which objects with at least several identical properties are combined into object groups and the object groups are mapped into classes and each class is realized by a simulation program part, whereby the mapping of an object from an object group in an instance of the class occurs in such manner that the instance is realized by setting at least one parameter in the simulation program part, whereby the latter becomes a parameterized simulation program part, in which the instances for simulation of communication between objects generate and process events, which is realized by a sequence of the parameterized simulation program parts, whereby the simulation sequence is controlled by activations of instances, wherein control of the simulation sequence occurs in a first simulation level by a main program after a cycle saved in the main program and comprising determined cycle increments, for processing a first cycle increment of a first cycle, at least one instance in the first cycle increment of a first class in the first cycle increment is selected by the main program for generating at least one first event, whereby the first event is realized by a value calculated with the parameterized simulation program part, at least comprising an information value and a time value with a cycle number and a cycle increment number, which is saved in an event memory assigned to a target instance and after generation of the first or all events is concluded, the program control is returned to the main program, the main program, if necessary, selects one or more further instances from the same or another class for generation and saving of at least one event each, if these are defined in the first cycle increment, until all the instances defined in the first cycle increment are processed and the processing of the first cycle increment is terminated by the return of the program control to the main program, for processing a further cycle increment of the first cycle at least a first instance in the further cycle increment of a first class in the further cycle increment is selected by the main program, whereby the parameterized simulation program part of the selected instance searches thorough the event memory assigned to it for events via search parameters, in the case of correspondence of the search parameters, the associated information value of the event by the parameterized simulation program part belonging to the instance, corresponding to the properties of the instance, is processed, that as a result of processing no, one or several events are generated and saved in an event memory area assigned to a target instance and the program control is returned to the main program, in the case of no correspondence of the search parameters with the parameters of the events saved in the associated event memory, the program control is returned to the main program, further instances in succession, for searching and processing events, are selected until all the instances defined in the second cycle increment are processed and the processing of the further cycle increment, by the return of the program control to the main program, is terminated, the main program runs through all further cycle increments of a cycle in succession, insofar as they are present, until the end of the first cycle is reached and that the main program periodically continues processing the simulation in a subsequent cycle, until either a specified number of cycles has passed or no further current event is to be processed, and in selected cycle increments and/or cycles of the simulation sequence, data of events and/or data generated by the processing of events by an instance is saved and subsequently evaluated by an evaluation program part.

2. Process according to claim 1, wherein the simulation is continued after running through of the first simulation level in a further simulation level and the simulation is continued after processing of all simulation levels in the first simulation level.

3. Process according to claim 2, wherein in the further simulation level, the same process for sequence control of the system simulation or another process is used.

4. Process according to claim 1, wherein the simulation is branched during processing of a cycle increment of a cycle of a first simulation level in a further simulation level and after termination of the processing in the further simulation level, the processing in a subsequent or the first simulation level is continued.

5. Process according to claim 1, wherein the event is deleted from the event memory area after processing of the events by the associated instance.

6. Process according to claim 1, wherein a division of the event memory into event memory areas is realized by a partialization of the memory or by parameterization of the instance and every event memory area is permanently assigned to a respective instance.

7. Process according to claim 1, wherein instances only save events in event memory areas specified in the main program.

8. Process according to claim 1, wherein control of the sequential processing of events within a cycle increment in an event memory area assigned to an instance occurs through the time value of the event, through user-defined priorities or through a topological sorting of the instance number, which is then a component of the event.

9. Process according to claim 1, wherein the processing of events of different instances within a cycle increment occurs in parallel through an arrangement into different threads.

10. Process according to claim 1, wherein events which are received and processed by an instance for a time value generate events for other instances or themselves with the same time value.

11. Process according to claim 1, wherein events which are received and processed by an instance for a time value generate events for other instances or themselves with another time value.

12. A system for sequence control of sequential object-oriented system simulations, said system comprising:

objects with at least several identical properties combined into object groups and the object groups are mapped into classes and each class is realized by a simulation program part, whereby the mapping of an object from an object group in an instance of the class occurs in such manner that the instance is realized by setting at least one parameter in the simulation program part, whereby the latter becomes a parameterized simulation program part, in which the instances for simulation of communication between objects generate and process events, which is realized by a sequence of the parameterized simulation program parts, whereby the simulation sequence is controlled by activations of instances; and a computing unit adapted such that control of the simulation sequence occurs in a first simulation level by a main program after a cycle saved in the main program and comprising determined cycle increments, and for processing a first cycle increment of a first cycle, at least one instance in the first cycle increment of a first class in the first cycle increment is selected by the main program for generating at least one first event, whereby the first event is realized by a value calculated with the parameterized simulation program part, at least comprising an information value and a time value with a cycle number and a cycle increment number, which is saved in an event memory assigned to a target instance and after generation of the first or all events is concluded, the program control is returned to the main program, the main program, if necessary, selects one or more further instances from the same or another class for generation and saving of at least one event each, if these are defined in the first cycle increment, until all the instances defined in the first cycle increment are processed and the processing of the first cycle increment is terminated by the return of the program control to the main program, for processing a further cycle increment of the first cycle at least a first instance in the further cycle increment of a first class in the further cycle increment is selected by the main program, whereby the parameterized simulation program part of the selected instance searches thorough the event memory assigned to it for events via search parameters, in the case of correspondence of the search parameters, the associated information value of the event by the parameterized simulation program part belonging to the instance, corresponding to the properties of the instance, is processed, that as a result of processing no, one or several events are generated and saved in an event memory area assigned to a target instance and the program control is returned to the main program, in the case of no correspondence of the search parameters with the parameters of the events saved in the associated event memory, the program control is returned to the main program, further instances in succession, for searching and processing events, are selected until all the instances defined in the second cycle increment are processed and the processing of the further cycle increment, by the return of the program control to the main program, is terminated, the main program runs through all further cycle increments of a cycle in succession, insofar as they are present, until the end of the first cycle is reached and that the main program periodically continues processing the simulation in a subsequent cycle, until either a specified number of cycles has passed or no further current event is to be processed, and in selected cycle increments and/or cycles of the simulation sequence, data of events and/or data generated by the processing of events by an instance is saved and subsequently evaluated by an evaluation program part.

13. The system according to claim 12, wherein the simulation is continued after running through of the first simulation level, in a further simulation level and the simulation is continued after processing of all simulation levels in the first simulation level.

14. The system according to claim 12, wherein a division of the event memory into event memory areas is realized by a partialization of the memory or by parameterization of the instance and every event memory area is permanently assigned to a respective instance.

15. The system according to claim 12, wherein the processing of events of different instances within a cycle increment occurs in parallel through an arrangement into different threads.

16. At least one program storage device readable by a machine, tangibly embodying at least one program of instructions executable by the machine to perform a process for sequence control of sequential object-oriented system simulations in which objects with at least several identical properties are combined into object groups and the object groups are mapped into classes and each class is realized by a simulation program part, whereby the mapping of an object from an object group in an instance of the class occurs in such manner that the instance is realized by setting at least one parameter in the simulation program part, whereby the latter becomes a parameterized simulation program part, in which the instances for simulation of communication between objects generate and process events, which is realized by a sequence of the parameterized simulation program parts, whereby the simulation sequence is controlled by activations of instances, wherein control of the simulation sequence occurs in a first simulation level by a main program after a cycle saved in the main program and comprising determined cycle increments,     for processing a first cycle increment of a first cycle, at least one instance in the first cycle increment of a first class in the first cycle increment is selected by the main program for generating at least one first event, whereby the first event is realized by a value calculated with the parameterized simulation program part, at least comprising an information value and a time value with a cycle number and a cycle increment number, which is saved in an event memory assigned to a target instance and after generation of the first or all events is concluded, the program control is returned to the main program,     the main program, if necessary, selects one or more further instances from the same or another class for generation and saving of at least one event each, if these are defined in the first cycle increment, until all the instances defined in the first cycle increment are processed and the processing of the first cycle increment is terminated by the return of the program control to the main program,     for processing a further cycle increment of the first cycle at least a first instance in the further cycle increment of a first class in the further cycle increment is selected by the main program, whereby the parameterized simulation program part of the selected instance searches thorough the event memory assigned to it for events via search parameters,     in the case of correspondence of the search parameters, the associated information value of the event by the parameterized simulation program part belonging to the instance,     corresponding to the properties of the instance, is processed, that as a result of processing no, one or several events are generated and saved in an event memory area assigned to a target instance and the program control is returned to the main program,     in the case of no correspondence of the search parameters with the parameters of the events saved in the associated event memory, the program control is returned to the main program,     further instances in succession, for searching and processing events, are selected until all the instances defined in the second cycle increment are processed and the processing of the further cycle increment, by the return of the program control to the main program, is terminated,     the main program runs through all further cycle increments of a cycle in succession, insofar as they are present, until the end of the first cycle is reached and that the main program periodically continues processing the simulation in a subsequent cycle, until either a specified number of cycles has passed or no further current event is to be processed, and     in selected cycle increments and/or cycles of the simulation sequence, data of events and/or data generated by the processing of events by an instance is saved and subsequently evaluated by an evaluation program part.

17. The at least one program storage device of claim 16, wherein the simulation is branched during processing of a cycle increment of a cycle of a first simulation level in a further simulation level and after termination of the processing in the further simulation level the processing in a subsequent or the first simulation level is continued.

18. The at least one program storage device of claim 16, wherein a division of the event memory into event memory areas is realized by a partialization of the memory or by parameterization of the instance and every event memory area is permanently assigned to a respective instance.

19. The at least one program storage device of claim 16, wherein control of the sequential processing of events within a cycle increment in an event memory area assigned to an instance occurs through the time value of the event, through user-defined priorities or through a topological sorting of the instance number, which is then a component of the event.

20. The at least one program storage device of claim 16, wherein events which are received and processed by an instance for a time value generate events for other instances or themselves with the same time value or another time value.

* * * * *

UNITED STATES PATENT AND TRADEMARK OFFICE
CERTIFICATE OF CORRECTION

| | | |
|---|---|---|
| PATENT NO. | : 7,353,160 B2 | |
| APPLICATION NO. | : 10/546464 | |
| DATED | : April 1, 2008 | |
| INVENTOR(S) | : Voigt | |

It is certified that error appears in the above-identified patent and that said Letters Patent is hereby corrected as shown below:

In The Claims:

Claim 2, Col. 12, Line 63: Delete "level and" and insert -- level, and --

Claim 4, Col. 13, Line 3: Delete "level and" and insert -- level, and --

Signed and Sealed this

Fifth Day of August, 2008

JON W. DUDAS
*Director of the United States Patent and Trademark Office*